(12) United States Patent
Chen Nieh et al.

(10) Patent No.: US 11,913,812 B2
(45) Date of Patent: Feb. 27, 2024

(54) CONTROL ASSEMBLY FOR USE IN OPERATION OF AN ELECTRIC DEVICE

(71) Applicants: Defond Electech Co., Ltd., Guangdong (CN); Defond Components Limited, Chai Wan (HK)

(72) Inventors: Cheng Chen Nieh, Chai Wan (HK); Chiu Keung Loong, Chai Wan (HK); Wai Man Wong, Chai Wan (HK)

(73) Assignees: Defond Electech Co., Ltd., Guangdong (CN); Defond Components Limited, Chai Wan (HK)

( * ) Notice: Subject to any disclaimer, the term of this patent is extended or adjusted under 35 U.S.C. 154(b) by 276 days.

(21) Appl. No.: 17/455,985

(22) Filed: Nov. 22, 2021

(65) Prior Publication Data
US 2022/0397426 A1 Dec. 15, 2022

(30) Foreign Application Priority Data
Jun. 11, 2021 (HK) .............................. 32021032944.9

(51) Int. Cl.
*A01D 34/416* (2006.01)
*G01D 5/14* (2006.01)
*G01R 33/00* (2006.01)
*G01R 33/07* (2006.01)
*G01R 33/09* (2006.01)
(Continued)

(52) U.S. Cl.
CPC ......... *G01D 5/145* (2013.01); *G01R 33/0076* (2013.01); *G01R 33/072* (2013.01); *G01R 33/091* (2013.01); *H02P 6/08* (2013.01); *H02P 6/30* (2016.02); *B25F 5/001* (2013.01)

(58) Field of Classification Search
CPC .. G01D 5/145; H02P 6/30; H02P 6/08; G01R 33/0076; G01R 33/072; G01R 33/091; B25F 5/001
See application file for complete search history.

(56) References Cited

U.S. PATENT DOCUMENTS

2018/0271012 A1* 9/2018 Guo .................. A01D 34/4166
2018/0335318 A1 11/2018 Kato
2019/0247973 A1* 8/2019 Zhong .................. B24B 55/00

FOREIGN PATENT DOCUMENTS

CN 101900526 A 12/2010
CN 103213106 A 7/2013
(Continued)

Primary Examiner — Cortez M Cook
(74) Attorney, Agent, or Firm — Kolisch Hartwell, P.C.

(57) ABSTRACT

A control assembly for controlling a speed or torque of operation of an electric device includes a control assembly housing, a magnetic sensor, a magnetic element; and an actuator. The actuator moves relative to the control assembly and, responsive to that movement, the magnetic sensor and magnetic element are moved relative to each other between a first position and a second position so that the magnetic sensor senses a first magnetic field reading when in the first position and senses a second magnetic field reading when in the second position. A control module is operably connected to the magnetic sensor and configured for controlling the electric device, and a magnetic shielding element is positioned within the control assembly housing to alleviate a magnetic signal source external to the control assembly from interfering with the sensing by the magnetic sensor.

24 Claims, 12 Drawing Sheets

(51) Int. Cl.
    *H02P 6/08*     (2016.01)
    *H02P 6/30*     (2016.01)
    *B25F 5/00*     (2006.01)

(56) References Cited

FOREIGN PATENT DOCUMENTS

| | | |
|---|---|---|
| CN | 104626032 A | 5/2015 |
| CN | 109831127 A | 5/2019 |
| CN | 209355950 U | 9/2019 |

* cited by examiner

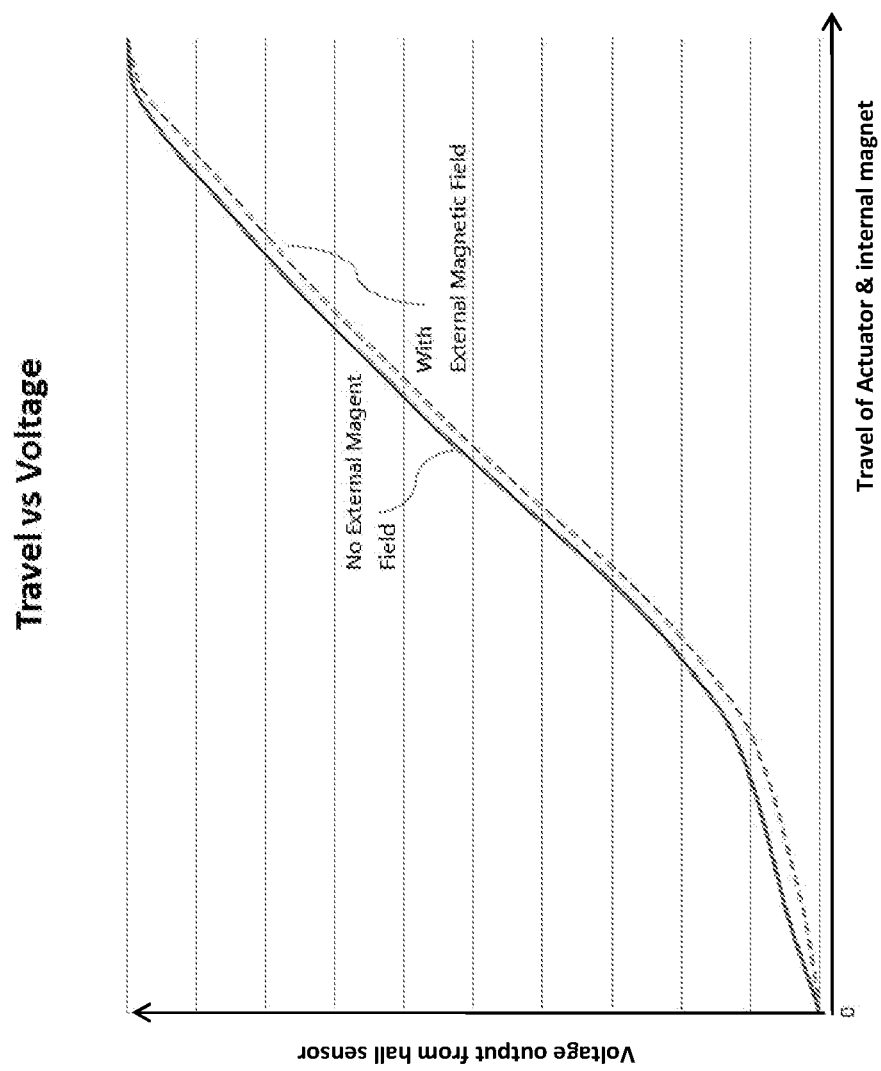

CONTROL ASSEMBLY FOR USE IN OPERATION OF AN ELECTRIC DEVICE

TECHNICAL FIELD

The present invention relates to control assemblies for use in effecting variable speed control and/or reversing operation of electric devices such as electrical power tools and the like.

BACKGROUND OF THE INVENTION

Conventional speed control in electric power tools may typically be implemented using a potentiometer or the like having a variable resistor element—for instance, a carbon film disposed on a printed circuit board. The effective resistance obtained from the carbon film may be varied in response to movement of an actuator which causes current carrying conductive wipers of the potentiometer to slide upon the surface of carbon film. This variable resistance may be used for instance in an RC circuit to produce a suitable time delay for controlling firing angles of thyristors which sequentially energise the stator windings of the electric motor and cause it to rotate at a desired speed. As the carbon film is subjected to repeated sliding movement of the conductive wipers upon its surface, both the carbon film and the conductive wipers may undergo considerable wear and tear which may ultimately result in inaccurate or erratic speed control operation. Also, the carbon film tends to be exposed to contaminant particles which not only have a tendency to cause short-circuiting of tracks on the conductive pads, but, may also exacerbate the damage caused by scraping of the conductive wipers along the carbon film.

Certain electrical switch units used in electric power tools will also include a reversing mechanism, for instance, to reverse the direction of rotation of a drill head of the power tool. The reversing mechanism may for instance comprise a reversing lever which is operable to effect reversal of internal switching contacts pairs for the purpose of reversing the direction of current flow delivered to the electric motor. In order to reverse the internal switching contacts, switching contacts will slide against each other resulting in wear and tear which may also compromise the accuracy and stability of current flow that is delivered to the motor.

SUMMARY OF THE INVENTION

The present invention seeks to alleviate at least one of the above-described problems.

The present invention may involve several broad forms. Embodiments of the present invention may include one or any combination of the different broad forms herein described.

In one broad form, the present invention provides a control assembly for use in controlling a speed or torque of operation of an electric device, the control assembly including:

a control assembly housing;
  a magnetic sensor;
  a magnetic element;
  an actuator that is configured for movement relative to the control assembly housing wherein responsive to said movement of the actuator relative to the control assembly housing, the magnetic sensor and magnetic element are moved relative to each other between at least one of a first position and a second position such that the magnetic sensor senses a first magnetic field reading when in the first position and senses a second magnetic field reading when in the second position;
  a control module operably connected to the magnetic sensor and configured for controlling the electric device to operate in at least one of a first speed or torque and a second speed or torque by reference to an output of the magnetic sensor indicative of the sensed first magnetic field reading and the second magnetic field reading respectively; and
  a magnetic shielding element suitably shaped and positioned within the control assembly housing so as to alleviate a magnetic signal source external to the control assembly from interfering with the sensing by the magnetic sensor of the first and second magnetic field readings produced by the magnetic element in response to movement of the actuator.

Preferably, the magnetic sensor may include a hall effect sensor.

Preferably, the magnetic sensor may be mounted to the control assembly housing and the magnetic element is mounted to the actuator.

Preferably, the magnetic sensor may be mounted to the actuator and the magnetic element is mounted to the control assembly housing.

Preferably, the control assembly may be integrally formed in an electric switch unit whereby the actuator comprises an actuator of the electric switch for closing and opening contacts of the electric switch unit.

Preferably, the output of the magnetic sensor may include a variable resistance that is indicative of at least one of the sensed first magnetic field reading and the second magnetic field reading.

Preferably, the magnetic sensor may include a magneto-resistive material.

Preferably, the speed or torque of operation of the electric device may include a speed or torque of operation of an electric motor of the electric device.

Preferably, the electric device may include at least one of an electric power tool and an electric gardening tool.

Preferably, the magnetic shielding element may include a three-dimensional closed loop configuration having one opened face via which the interior of the shielding element may be accessed.

Preferably, the magnetic element may include a cylindrical shaped configuration.

Preferably, the magnetic shielding element may be formed from a material including at least one of Fe-3% Si and Fe-8% Ni.

In another broad form, the present invention provides a control assembly for use in selectably controlling forward and reverse operation of an electric device, the control assembly including:

a control assembly housing;
  a magnetic sensor;
  a magnetic element;
  an actuator that is configured for movement relative to the control assembly housing wherein responsive to said movement of the actuator relative to the control assembly housing, the magnetic sensor and magnetic element are moved relative to each other between at least one of a first position and a second position such that the magnetic sensor senses a first magnetic field reading when in the first position and senses a second magnetic field reading when in the second position;
  a control module operably connected to the magnetic sensor and configured for controlling the electric device to operate in at least one of a forward operational mode and a reverse operational mode by reference to an output of the magnetic sensor indicative of the sensed first magnetic field reading and the second magnetic field reading respectively; and a magnetic shielding element suitably shaped and positioned within the control assembly housing so as to alleviate a magnetic signal source external to the control assembly from interfering with the sensing by the magnetic sensor of the first and second magnetic field readings produced by the magnetic element in response to movement of the actuator.

Preferably, the magnetic sensor may include a hall effect sensor.

Preferably, the magnetic sensor may be mounted to the control assembly housing and the magnetic element is mounted to the actuator.

Preferably, the magnetic sensor may be mounted to the actuator and the magnetic element may be mounted to the control assembly housing.

Preferably, the control assembly may be integrally formed in an electric switch unit whereby the actuator comprises a reversing lever of the electric switch unit.

Preferably, the output of the magnetic sensor may include a variable resistance that may be indicative of at least one of the sensed first magnetic field reading and the second magnetic field reading.

Preferably, the magnetic sensor may include a magnetoresistive material.

Preferably, the forward and reverse operation of the electric device may include a forward and reverse operation of an electric motor of the electric device.

Preferably, the electric device may include at least one of an electric power tool and an electric gardening tool.

Preferably, the magnetic shielding element may include a three-dimensional closed loop configuration having one opened face via which the interior of the shielding element may be accessed.

Preferably, the magnetic element may include a cylindrical shaped configuration.

Preferably, the magnetic shielding element may be formed from a material including at least one of Fe-3% Si and Fe-8% Ni.

BRIEF DESCRIPTION OF THE DRAWINGS

The present invention will become more fully understood from the following detailed description of a preferred but non-limiting embodiments thereof, described in connection with the accompanying drawings, wherein:

FIG. 5 depicts the trigger assembly of an embodiment of the present invention exposed to external magnetic fields which may interfere with the signal output of the magnetic sensor and which may inadvertently cause the device to switch on.

FIG. 6 shows a graph of voltage output from a magnetic sensor (e.g. a hall sensor) vs strength of an external magnetic field to which the magnetic sensor is exposed in which it can be seen that instability of output of the magnetic sensor may inadvertently cause a start switch of the device to switch on.

FIG. 11 shows a graph of voltage output from a magnetic sensor (e.g. a hall sensor) used in certain above-described embodiments in which the magnetic shielding element is fitted vs the actuator at a switch off position in which it can be seen that the output voltage signal of the hall sensor remains safely below a threshold level (i.e. represented by the dotted line) at which the device may be switched on.

FIG. 12 shows a graph of voltage output from a magnetic sensor (e.g. a hall sensor) vs travel/displacement of the actuator/magnetic element in accordance with an embodiment of the present invention with the magnetic shielding element installed where the sensor is exposed to an external magnetic field (i.e. the dotted line curve) and where no external magnetic field is applied (i.e. the solid line curve).

DETAILED DESCRIPTION OF THE PREFERRED EMBODIMENTS

Preferred embodiments of the present invention will now be described herein with reference to FIGS. 1A to 12. The embodiments comprise a variable-speed trigger control assembly for use with an electric power tool including for instance an electric drill, grinder, sander, saw, rotary driving tool and the like. It would be appreciated and understood that whilst this embodiment is described for use with an electric power tool, this is merely for purposes of illustrating functionality and alternate embodiments of the present invention may of course be used with other types of electrical devices such as gardening tools. Furthermore, whilst embodiments of the present invention described herein refer to electric devices comprising an electric motor, it would be appreciated that alternate embodiments of the present invention may also be applicable to electric devices which comprise a solenoid type electro-mechanical unit to effect operable movement (e.g. reciprocal motion) of the electric device.

The electric power tool includes a brushless DC motor (10) comprising a rotor and a stator for supplying a magnetic field that drives the rotor. The rotor of the brushless DC motor (10) includes an output shaft supported by a number of bearings for providing output torque and is surrounded by a permanent magnet that generates a magnetic field. The stator is mounted around the rotor with an air-gap being disposed therebetween. Stator windings are located in the air-gap arranged relatively parallel with the rotor output shaft and may typically be connected in either of a Delta configuration or a three-phase wye wiring configuration. When current flows through a stator winding, the resulting current in the stator winding generates a magnetic field that magnetically couples with the rotor and which "drags" the rotor around with it. The magnetic field generated by the permanent magnet in the rotor assembly will tend to align itself with the magnetic field generated by the stator such that the rotor will undergo rotational movement. Accordingly, by controlling the timing and sequential energisation of the stator windings, this enables control of rotational movement of the rotor shaft to be set at any desired speed and direction of operation as will be described in greater detail below.

Figure 1A:
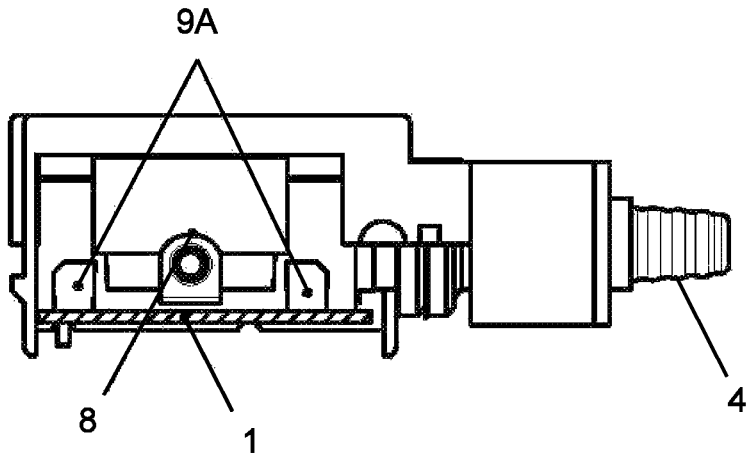
FIG. 1A shows a top view of an electrical switch unit for use with an electrical power tool, the electrical switch unit comprising a control assembly with a variable speed control mechanism and a reversing mechanism in accordance with an embodiment of the present invention.
Figure 1B:
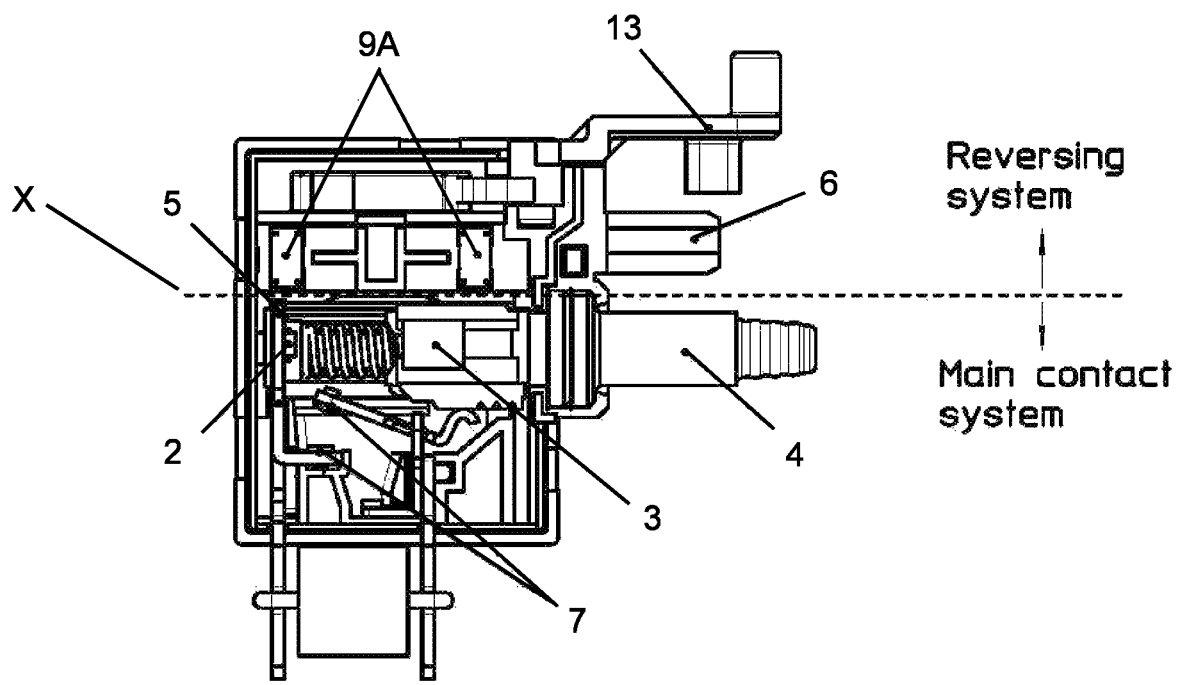
FIG. 1B shows a side cut-away view of the electrical switch unit embodiment of FIG. 1.

Referring to FIGS. 1A and 1B, the variable-speed trigger control assembly includes a molded plastic housing for mounting to a body of the electric power tool near to a handle of the electric power tool. The housing includes a first housing member (6) and a second housing member (not shown) that may be snap-fitted or screwed together to substantially enclose at least some of the components of the trigger control assembly therein. The variable-speed trigger control assembly includes an actuator (4) having a finger-operable portion and actuator shaft operably connected to a movable switching contact of the electrical switch unit. When the trigger is squeezed, the actuator shaft (4) is linearly slidable along a movement axis (X) inwardly of an opening in the housing (6) from an OFF position towards an ON position (whereby the movable contact (7) is brought into contact with a fixed contact of the electrical switch unit), and, outwardly of the opening in the housing from the ON position toward the OFF position (whereby the movable contact (7) is moved out of contact from the fixed contact) by urging of a return spring.

A magnetic element (3) is disposed on the actuator shaft (4) and a corresponding magnetic sensor (2) is disposed on the housing (6) such that when the actuator shaft (4) slides inwardly and outwardly of the housing (6) along the movement axis (X) the magnetic sensor (2) is configured to sense varying magnetic field readings from the magnetic element (3) indicative of a relative distance of the magnetic element (3) from the magnetic sensor (2). In this embodiment, the magnetic sensor (2) is embodied by a hall effect sensor although in other embodiments any other suitable type of magnetic sensor (2) may be configured of use instead to sense the magnetic field or other magnetic-related properties of the corresponding magnetic element (3). In yet other embodiments, it is possible to utilize one or more optical sensors in substitute for the magnetic sensor (2). For simplicity, the magnetic element (3) could comprise a suitably sized and dimensioned permanent magnet that is suitably fixed to the actuator shaft (4). It would also be appreciated that in alternate embodiments of the present invention, the positioning of the magnetic sensor (2) and the magnetic element (3) could be reversed whereby the magnetic sensor (2) could be mounted on to the actuator shaft (4) whilst the magnetic element (3) could be mounted to the housing (6).

When the actuator shaft (4) is arranged in the OFF position, the electrical contacts (7) within the electrical switch unit are disconnected and the electric motor (10) outputs zero rotational speed. When the actuator shaft (4) is moved in to the ON position, the electrical contacts (7) within the electrical switch unit are closed and electrical communication is effected between the power supply and the electric motor (10). The magnetic element (3) may be arranged in any one of a plurality of possible positions relative to the magnetic sensor (2) when the electrical switch contacts (70) are closed, depending upon how hard the trigger is squeezed by the user's finger. For instance, when the trigger is initially squeezed and the electrical switch contacts (7) are first brought into the closed configuration, the distance of the magnetic element (3) from the magnetic sensor (2) may be at a relative maximum distance during the ON mode of the electrical switch unit which is indicated by the relatively minimum magnetic field reading sensed by the magnetic sensor (2) during the ON mode. As the trigger is squeezed further by the user's finger, and the magnetic element (3) is gradually moved closer to the magnetic sensor (2) with sliding movement of the actuator shaft (4), the magnetic sensor (2) will gradually sense increasingly stronger magnetic field readings from the magnetic element (3). When the magnetic element (3) is at a relative minimum distance from the magnetic sensor (2) during the ON mode of the electric switch, a relative maximum magnetic field reading will be sensed by the magnetic sensor (2). The hall effect sensor is configured to output a variable resistance that is proportional to the magnetic field sensed by the sensor. The hall effect sensor (2) is mounted on to a sensor PCB (5) having suitable circuitry disposed thereon which converts this variable resistance into a variable voltage signal which serves as an input into a control module (11) for suitably controlling the operation of the brushless DC motor (10) by reference to the speed indicated by the input variable voltage signal.

The control module (11) comprises motor control circuitry which receives the variable voltage signal and in response, outputs an electrical control module signal which drives operation of a power module comprising the plurality of MOSFETs interfaced with corresponding input terminals of the stator windings of the DC brushless motor (10). By sequentially activating the individual stator windings via the MOSFETS in accordance with controlled timing and sequence by reference to the control module (11), the permanent magnet of the rotor continuously follows the advancing magnetic field generated by the stator windings. The control module includes a microcontroller semiconductor (11) that is programmed to output the control module signals which drive the plurality of MOSFETs of the power module to energise their corresponding stator windings in accordance with a predetermined timing and sequence so that the brushless DC motor (10) operates in a predetermined manner (i.e. speed, direction, torque) corresponding to the actuator (4) movement indicated by the output of the hall effect sensor (2). The speed and torque of the DC brushless motor (10) is dependent upon the amount of power that can be supplied to the stator windings via their corresponding input MOSFETs. In these embodiments, the amount of power supplied to the stator windings can be controllably varied by use of pulse width modulation techniques whereby the output of a timing signal generator (e.g. a "555" circuit) is used as an input to gates of the MOSFETs to suitably effect high speed switching of the MOSFETs whereby the resulting power switched through the MOSFETs to the stator windings provides the desired amount of speed and torque produced by the DC brushless motor (10). The timing signal generator signal may therefore serve as the control module signal for controlling operation of the MOSFETs. In certain embodiments, the control module (11) may also include voltage regulation and protection circuitry to regulate the input voltage from the DC power supply to each of the MOSFETs. The magnetic sensor PCB (5) is operably-connected with the main PCB (1) which has the control module semiconductor (1) mounted thereon. The control module (11) and other electronic components disposed on the PCB (1) are powered by a power supply of the electric device which in this embodiment comprises a battery module.

Figure 2A:
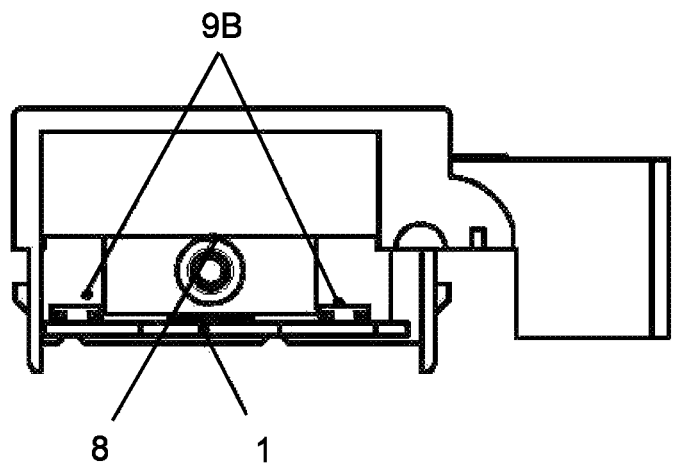
FIG. 2A shows a top view of an electrical switch unit for use with an electrical power tool, the electrical switch unit comprising a control assembly with a variable speed control mechanism and reversing mechanism in accordance with another embodiment of the present invention.
Figure 2B:
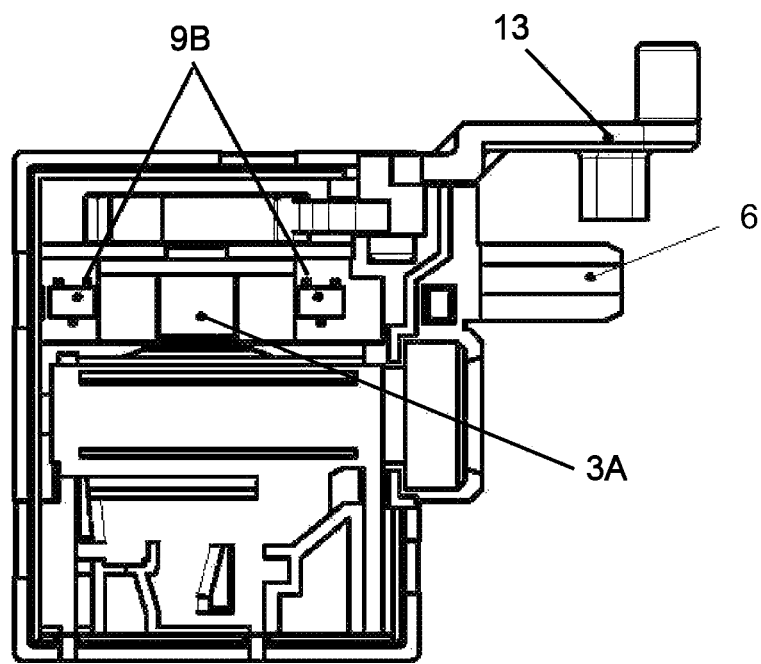
FIG. 2B shows a side cut-away view of the electrical switch unit embodiment of FIG. 3.
Figure 3:
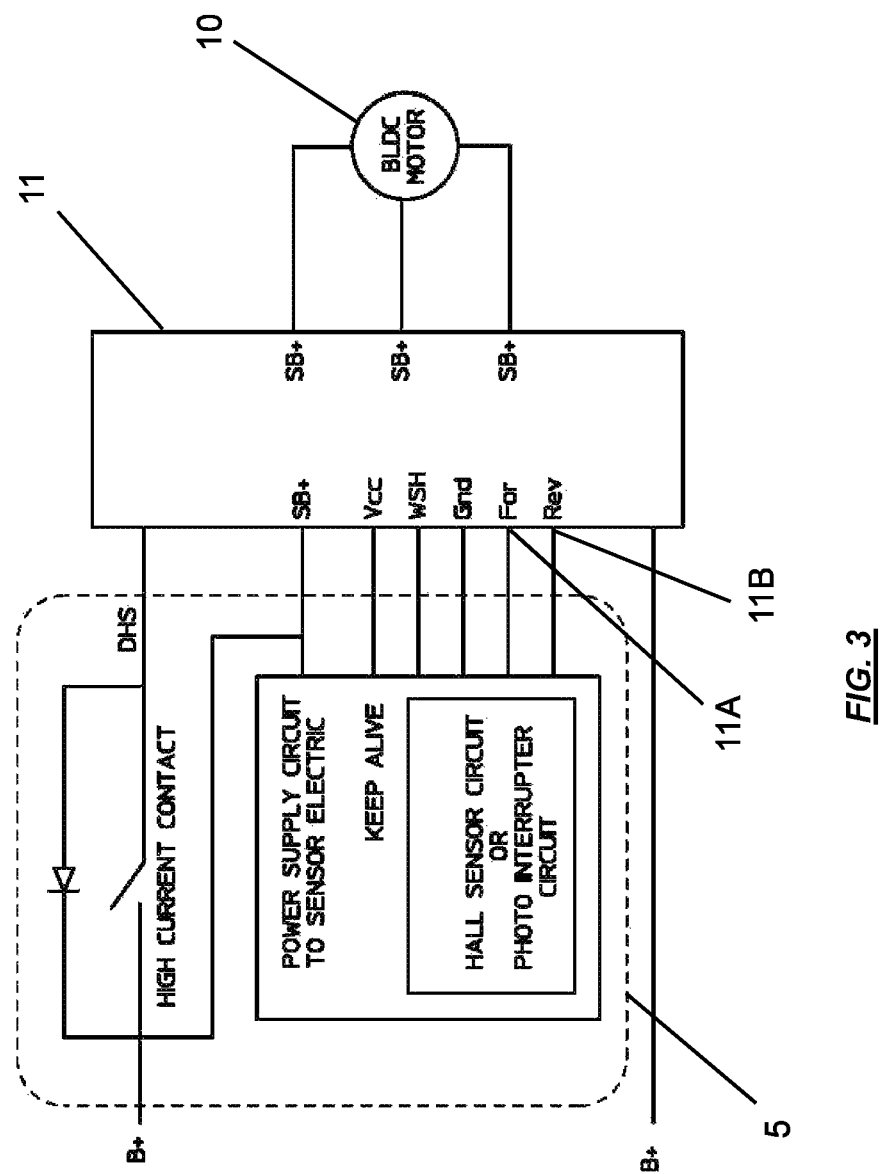
FIG. 3 shows output signals of a controller assembly as inputs into an integrated circuit of a control module configured for providing control signals to a brushless DC motor of the electric device in accordance with an embodiment of the present invention.
Figure 5:
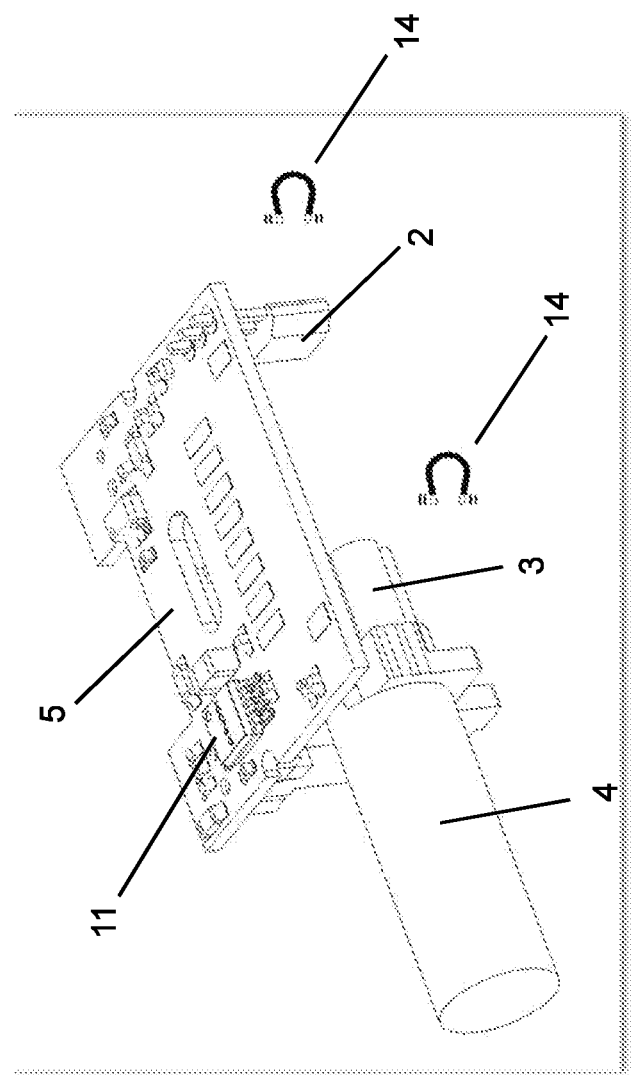

The control assembly also includes a contactless reversing mechanism for controlling the direction of operation of the electric motor—i.e. in either a forward or a reverse operational mode. In one embodiment, as shown in FIGS. 2A and 2B, the reversing mechanism includes a pair of optical sensors (9A)—for instance, a pair of photo-interrupter elements that are positioned within the housing (6). Each photo-interrupter element (9A) includes an infra-red light emitter and photo-transistor pair separated by a gap. When the gap is not occluded, the infra-red light from the photo-transistor traverses the gap and is received by the corresponding photo-transistor and current flows through the photo-transistor. When the gap is occluded, the current flow through the photo-transistor will be cut-off. In this embodiment, the output of a first photo-interrupter element is interfaced with the "forward rotation" input pin of the control module semiconductor chip (11) as shown in FIG. 5 whilst the output of a second photo-interrupter element is interfaced with the "reverse rotation" input pin of the control module semiconductor chip. Accordingly, the control module (11) is programmed to change the direction of motor rotation by reversing the voltage across the stator windings—in effect reversing the communication sequence so that the motor changes directional rotation depending upon which of the forward rotation or reverse rotation input pins are activated by the optical sensor (9A) outputs during operation. In this embodiment, the reversing mechanism includes a reversing lever (13) that is pivotable about a pivot member and is operably-connected to a reversing carriage (8) which slides linearly along a track within the housing (6) above the actuator shaft (4) as the reversing lever (13) is pivoted about the pivot member. When the reversing lever (13) is pivoted in to a "forward rotation" position, the reversing carriage (8) is configured to occlude the gap of the second photo-interrupter element but does not occlude the gap of the first photo-interrupter element, such that the "reverse rotation" input pin (11B) of the control module semiconductor chip (11) will not be activated and "forward rotation" input pin (11A) will be activated. Conversely, when the reversing lever is pivoted in to the "reverse rotation" position, the reversing carriage is configured to occlude the gap of the first photo-interrupter element but not that of the second photo-interrupter element, such that the "forward rotation" input pin (11A) of the control module semiconductor chip will not be activated and the "reverse rotation" input pin (11B) will be activated.

In an alternate embodiment of the present invention, as shown in FIGS. 3A and 3B, instead of using signal outputs of optical sensors (9A) to selectably trigger forward or reverse rotational operation of the electric motor (10), a pair of magnetic sensors (9B) may be positioned within the housing (6). By way of example, the output of a first magnetic sensor is interfaced with the "forward rotation" input pin (11A) of the control module semiconductor chip (11) whilst the output of a second magnetic sensor is interfaced with the "reverse rotation" input pin (11B) of the control module semiconductor chip (11). A magnetic element (3A) is mounted on a spring loaded reversing carriage (8) so as to be slidably movable between the pair of magnetic sensors (9B) in response to pivoting of the reversing lever (13) about the pivot member. When the reversing lever (13) is pivoted in to a "forward rotation" position (its default position), the magnetic element (3A) disposed on the reversing carriage (8) is arranged in to relatively close proximity to the first magnetic sensor. The first magnetic sensor outputs a variable resistance/voltage indicative of the sensed magnetic field of the magnetic element which is calibrated by a sensor PCB to activate the "forward rotation" input pin (11A) of the control module semiconductor chip (11). As the magnetic element (3A) is relatively distant from the second magnetic sensor, the second magnetic sensor will output a variable resistance/voltage which is calibrated so as not to be capable of activating the "reverse rotation" input pin (11B) of the control module semiconductor chip (11). Conversely, when the reversing lever (13) is pivoted in to the "reverse rotation" position, the magnetic element (3A) disposed on the reversing carriage (8) is arranged in to relatively close proximity to the second magnetic sensor. The second magnetic sensor outputs a variable resistance/voltage indicative of the sensed magnetic field of the magnetic element (3A) which is calibrated to activate the "reverse rotation" input pin (11B) of the control module semiconductor chip (11). As the magnetic element (3A) is relatively distant from the first magnetic sensor, the first magnetic sensor will output a variable resistance/voltage which is calibrated so as to be not capable of activating the "forward rotation" input pin (11A) of the control module semiconductor chip (11).

Figure 4A:
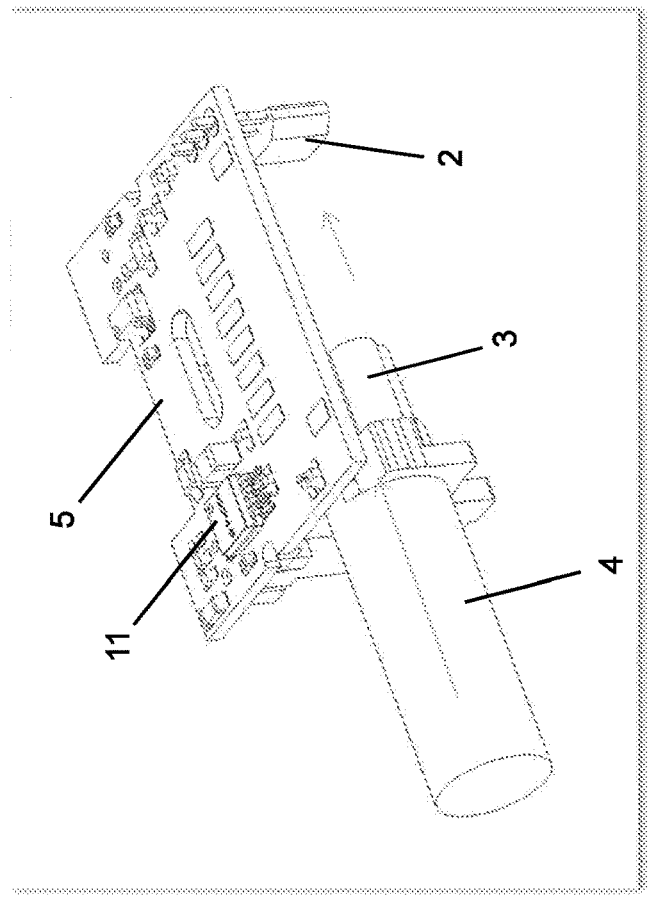
FIG. 4A shows an embodiment of the present invention in which the actuator contains an internal magnet (the magnet not being visible due to concealment within the actuator in this view).
Figure 4B:
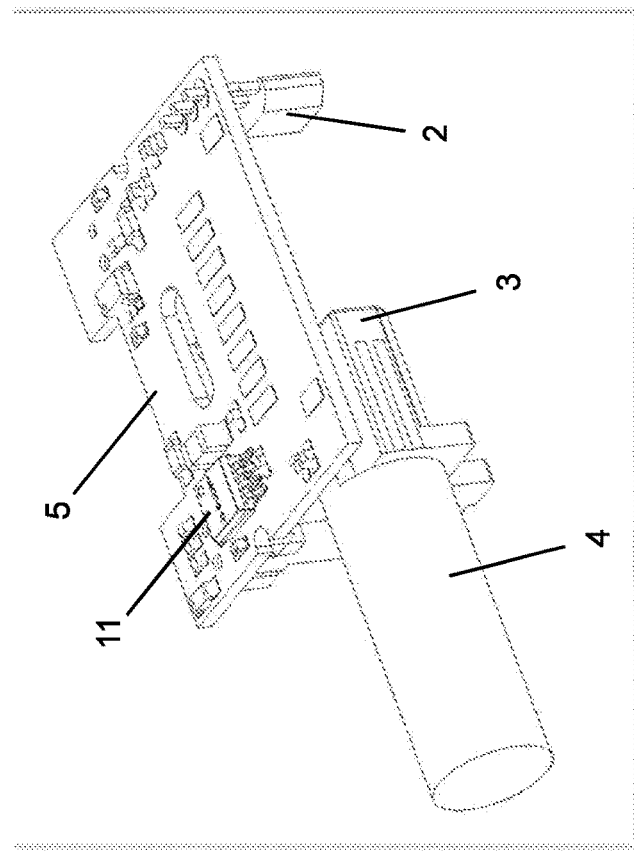
FIG. 4B shows the embodiment of FIG. 4A in which the actuator contains an internal magnet (the magnet being visible in a partial cut-away view of the actuator).
Figure 6:
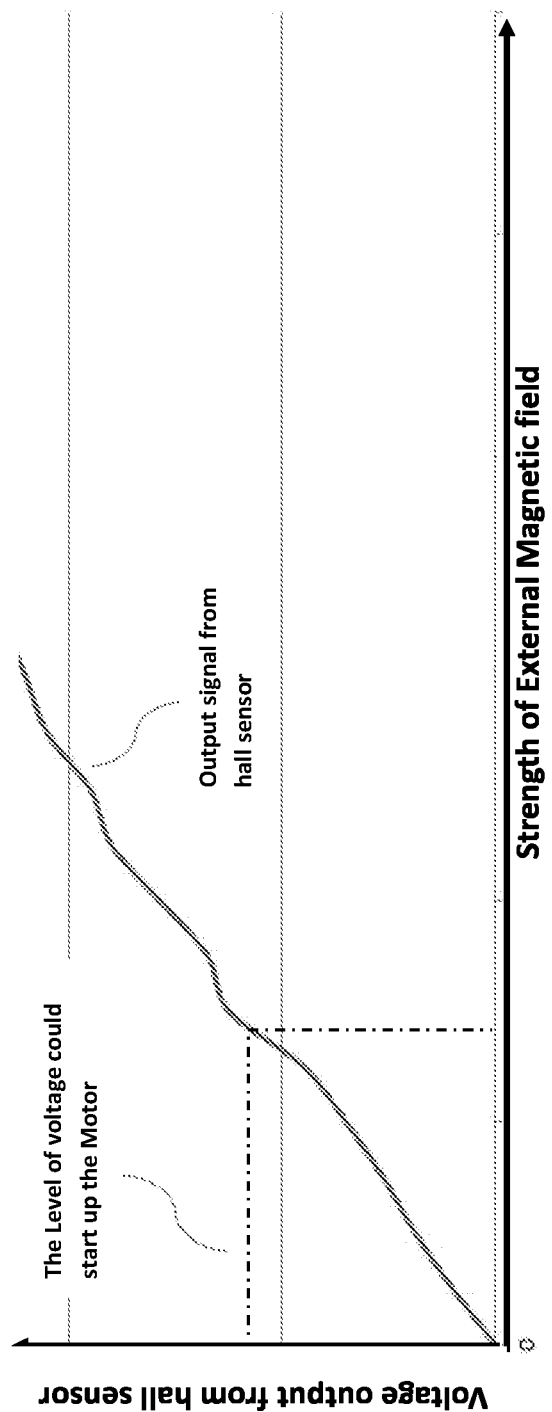
Figure 7:
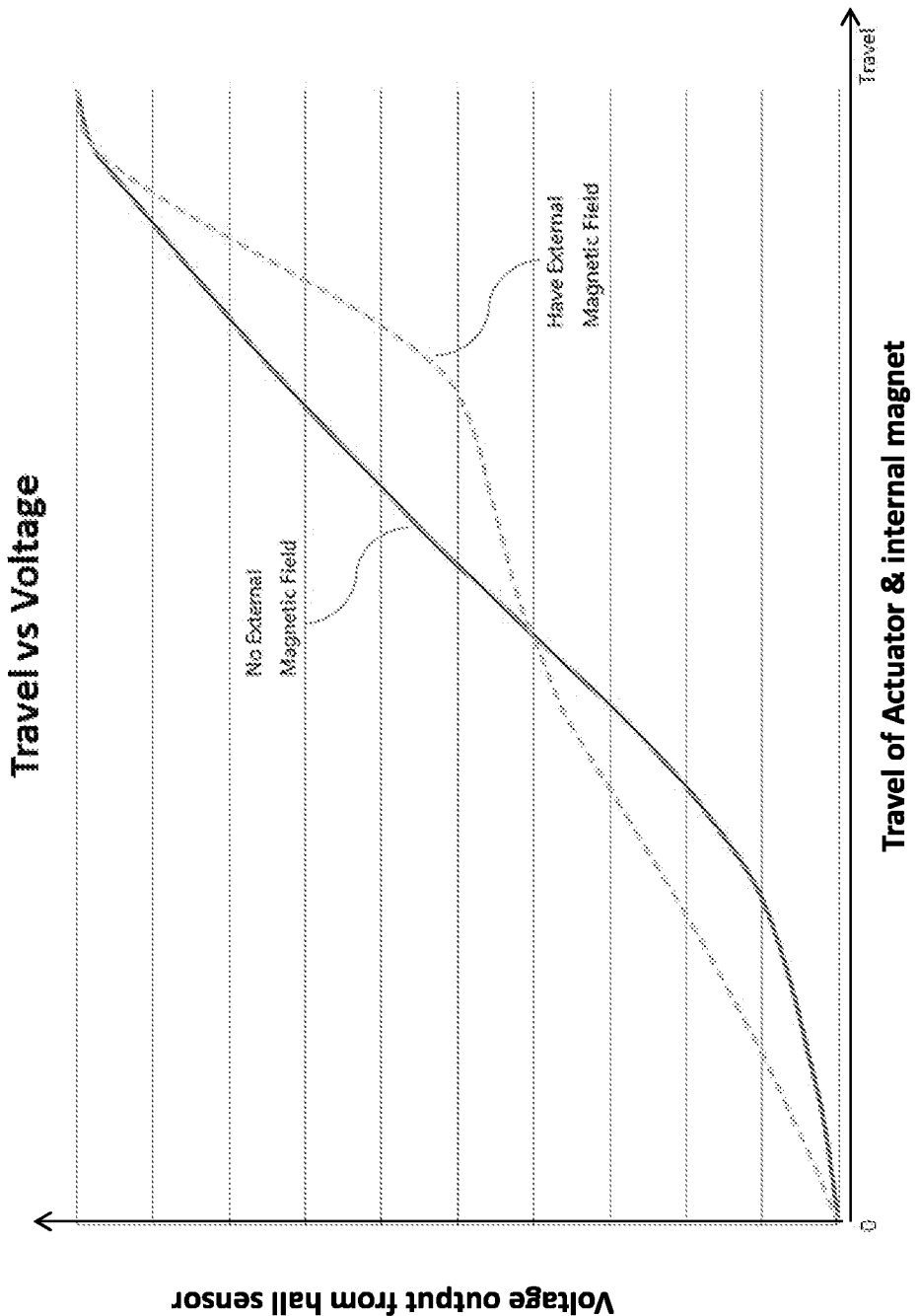
FIG. 7 shows a graph of voltage output from a magnetic sensor (e.g. a hall sensor) vs travel/displacement of the actuator/magnetic element in which the voltage output of the sensor may deviate unstably from the expected output voltage curve as the magnetic sensor is variably exposed to the external magnetic field during travel/displacement of the actuator/magnetic element.

Referring now to FIGS. 4A-12 a further embodiment of the present invention is disclosed in which the preceding described embodiments include a further feature of a magnetic shielding element (15) to assist in shielding the magnetic element (3) and/or the magnetic sensor (2) from external magnetic interference (14). FIG. 4A shows one of the preceding embodiments in which the magnetic element (3) is rigidly mounted on the actuator shaft (4) and moves together with the actuator shaft (4) towards the magnetic sensor (2) when the trigger is pressed by a user. The magnetic sensor (2) (for instance a Hall sensor) will then generate a voltage signal for controlling speed or torque of the device based on the sensed magnetic flux intensity. It can be seen that both the magnetic sensor (2) and the magnetic element (3) are exposed to external magnetic interference (14) which may result in false and unreliable readings being sensed by the magnetic sensor (2) and erroneous speed/torque control signals being generated. FIGS. 6 and 7 show graphs depicting the distorted operation of the device resulting from the external magnetic interference (14). An erroneous voltage signal generated by the magnetic sensor (2) may be of sufficient magnitude to start the ON switch of the device and cause the motor (10) to switch on. If the device is an electric power tool, such unexpected switching ON of the device can be extremely dangerous to the user. Furthermore, An erroneous voltage signal generated by the magnetic sensor (2) may result in unstable or unreliable speed/torque control of the device.

Figure 8B:
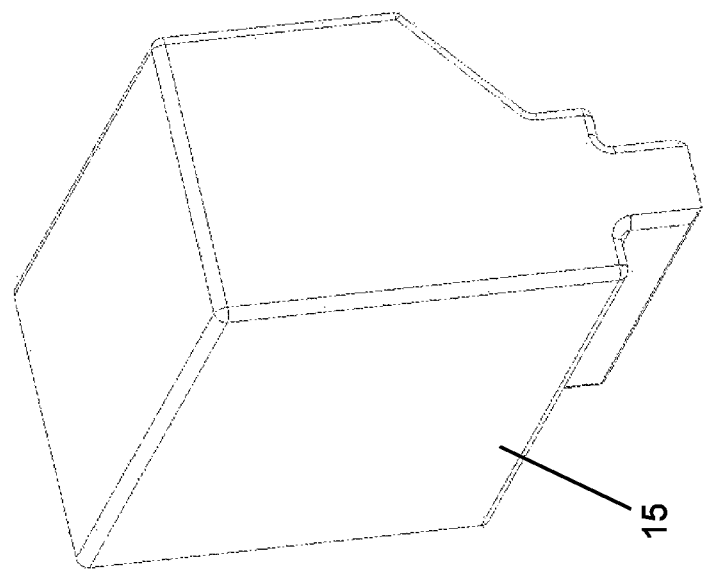
FIGS. 8A and 8B show a front and rear perspective view respectively of one embodiment of a magnetic shielding element (e.g. having a single open-ended irregular closed loop shape) used in accordance with a further embodiment of the present invention for shielding the magnetic sensor and/or magnetic element from exposure to external magnetic fields.
Figure 8A:
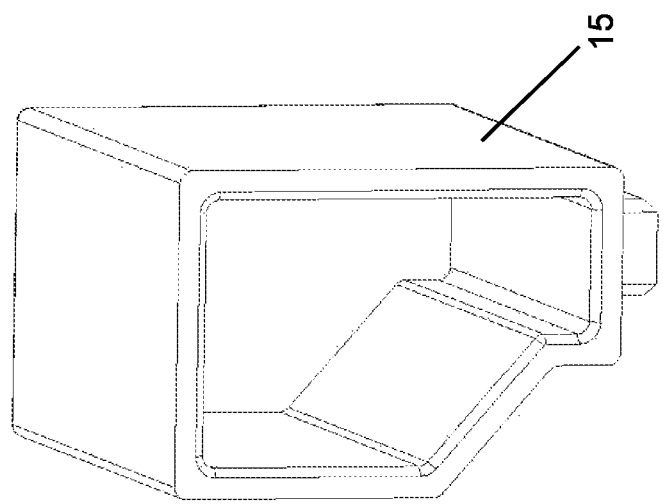
Figure 9:
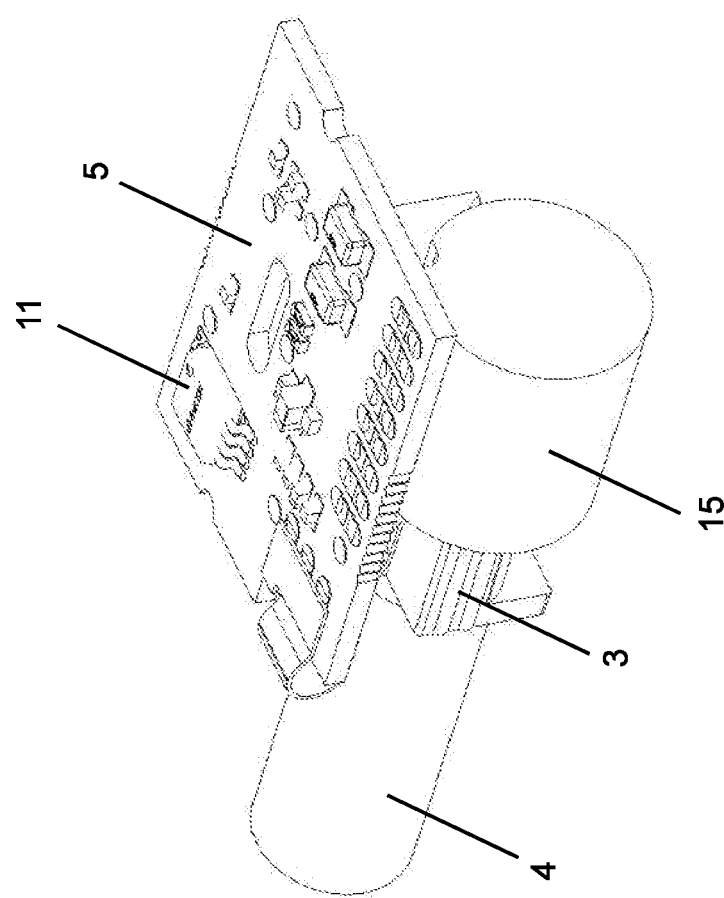
FIG. 9 shows a perspective view of an alternative magnetic shielding element (e.g. in a cylindrical shape) used in an alternative embodiment of the present invention for shielding the magnetic sensor and/or magnetic element from exposure to external magnetic fields.
Figure 10B:
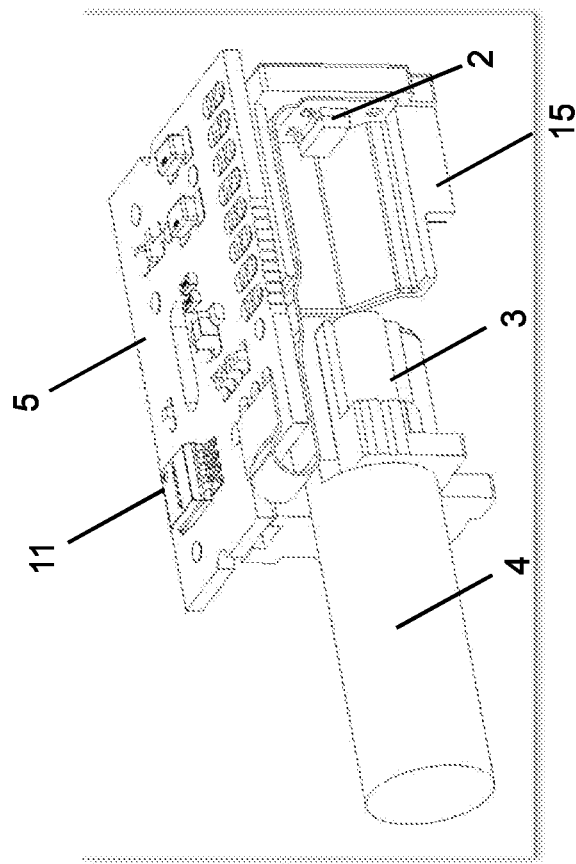
FIGS. 10A and 10B show a perspective view and partial cut-away perspective view respectively of the single open-ended irregular closed loop shaped embodiment of the shielding element fitted to a trigger assembly to alleviate exposure of the magnetic sensor and/or magnetic element on the actuator to external magnetic fields.
Figure 10A:
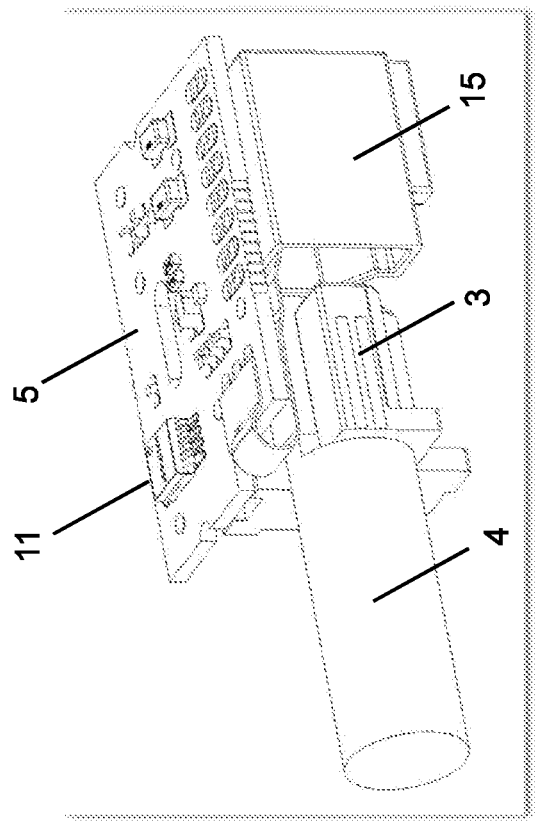

One example of the magnetic shielding element (15) of the further embodiment is shown in FIGS. 8A-10B. The magnetic shielding element (15) includes a closed loop configuration having one opened face via which the interior of the shielding element may be accessed. For instance, the shielding element (15) may include a customized three-dimensional shaped configuration as shown in the examples of FIGS. 8A and 8B, or, may be formed in a cylindrical shaped configuration as shown in the example of FIG. 9. Also, as shown in FIGS. 9 and 10A, the shielding element is configured for positioning within the housing so as to surround the magnetic sensor (2) and whereby as the actuator shaft (4) is pressed inwardly of the housing, the magnetic element (3) mounted on the actuator shaft (4) is able to enter the magnetic shielding element (15) via its one opened face, so as to reduce the occurrence of interference from external magnetic signal sources (14). As shown in FIG. 10B, the magnetic sensor (2) of this embodiment is communicably connected with the sensor PCB (5) via a soft conductive medium which extends from the PCB (5) into the interior of the magnetic shielding element (15) via the opened face of the shielding element (15). Further, in these embodiments, the magnetic shielding element (15) is formed from a material such as Fe-3% Si or Fe-8% Ni. Yet further, the magnetic shielding element (15) is formed from a material having suitable magnetic permeability so as to filter external magnetic interference sources. Yet further, in certain embodiments, the magnetic shielding element (15) may be suitably shaped and positioned so as to provide both magnetic shielding but also waterproof sealing to prevent ingress of water into contact with at least one of the magnetic element (3) and the magnetic sensor (2). Advantageously, in certain embodiments, the magnetic shielding element (15) may serve a dual function as both a magnetic shielding element as well as a waterproof sealing element at the same time which may obviate the need for utilizing separate magnetic shielding and waterproofing elements in the device. Such an arrangement may simplify the overall design, manufacturing time, cost and complexity in that a single dual-purpose component may be installed in to the device in a single assembly step to provide the aforementioned dual functionality.

Figure 11:
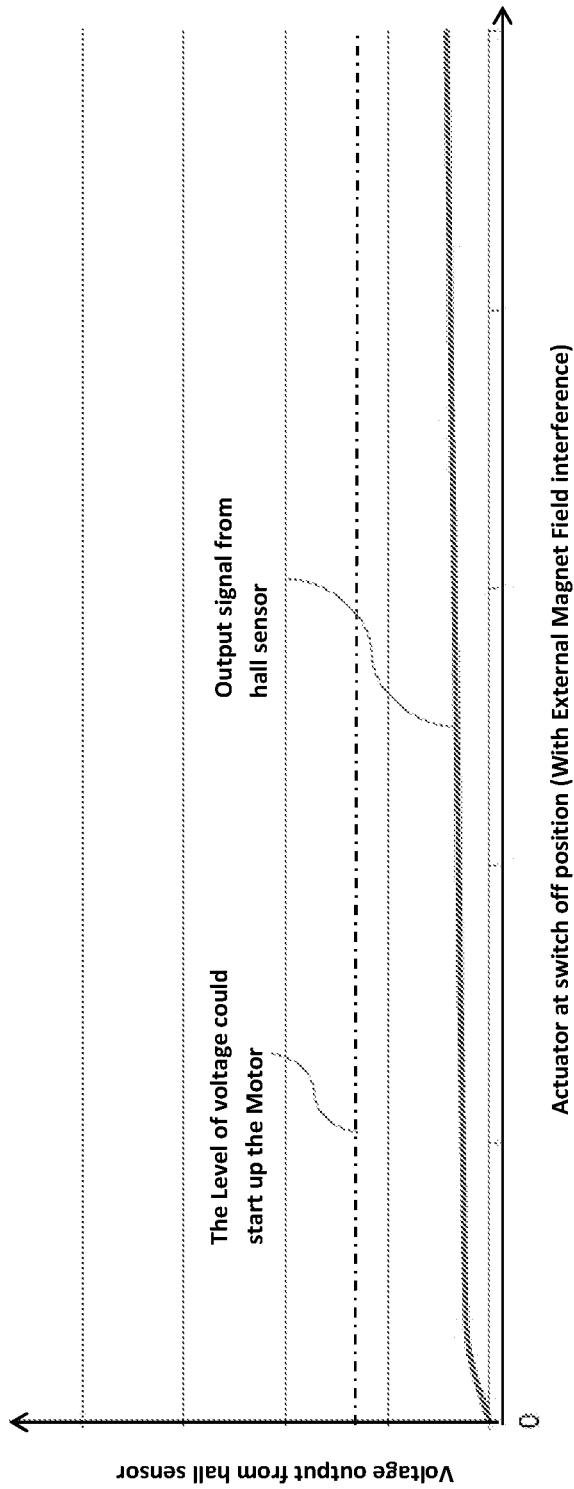

Embodiments of the present invention assist in providing an advantage over the existing art in that variable speed control and/or forward/reversing operational mode control of an electric power tool may be effected using substantially contactless mechanisms comprising for instance, magnetic or optical type sensors, which alleviate susceptibility to wear and tear associated with the existing art, reduces ongoing maintenance and repair costs, and improves the overall lifespan of the electric power tool. Further, embodiments of the present invention may assist in alleviating magnetic interference with the signaling between magnetic element and the magnetic sensor so as to improve the reliability and stability of operation of the device, and to prevent inadvertent operation of the device due to erroneous signaling being sensed as a result of the external magnetic interference. FIG. 11 shows a graph of voltage output from a magnetic sensor (e.g. a hall sensor) used in certain above-described embodiments in which the magnetic shielding element is fitted vs the actuator at a switch off position in which it can be seen that the output voltage signal of the hall sensor remains safely below a threshold level (i.e. represented by the dotted line) at which the device may be switched on. FIG. 12 shows a graph of voltage output from a magnetic sensor (e.g. a hall sensor) vs travel/displacement of the actuator/magnetic element in accordance with an embodiment of the present invention with the magnetic shielding element installed where the sensor is exposed to an external magnetic field (i.e. the dotted line curve) and where no external magnetic field is applied (i.e. the solid line curve).

Those skilled in the art will appreciate that the invention described herein is susceptible to variations and modifications other than those specifically described without departing from the scope of the invention. All such variations and modification which become apparent to persons skilled in the art, should be considered to fall within the spirit and scope of the invention as broadly hereinbefore described. It is to be understood that the invention includes all such variations and modifications. The invention also includes all of the steps and features, referred or indicated in the specification, individually or collectively, and any and all combinations of any two or more of said steps or features.

The reference to any prior art in this specification is not, and should not be taken as, an acknowledgment or any form of suggestion that that prior art forms part of the common general knowledge.

What is claimed:

1. A control assembly for use in controlling a speed or torque of operation of an electric device, the control assembly including:
    a control assembly housing;
    a magnetic sensor;
    a magnetic element;
    an actuator that is configured for movement relative to the control assembly housing wherein responsive to said movement of the actuator relative to the control assembly housing, the magnetic sensor and magnetic element are moved relative to each other between at least one of a first position and a second position such that the magnetic sensor senses a first magnetic field reading when in the first position and senses a second magnetic field reading when in the second position;
    a control module operably connected to the magnetic sensor and configured for controlling the electric device to operate in at least one of a first speed or torque and a second speed or torque by reference to an output of the magnetic sensor indicative of the sensed first magnetic field reading and the second magnetic field reading respectively; and
    a magnetic shielding element suitably shaped and positioned within the control assembly housing so as to alleviate a magnetic signal source external to the control assembly from interfering with the sensing by the magnetic sensor of the first and second magnetic field readings produced by the magnetic element in response to movement of the actuator.

2. A control assembly as claimed in claim 1 wherein the magnetic sensor includes a hall effect sensor.

3. A control assembly as claimed in claim 1 wherein the magnetic sensor is mounted to the control assembly housing and the magnetic element is mounted to the actuator.

4. A control assembly as claimed in claim 1 wherein the magnetic sensor is mounted to the actuator and the magnetic element is mounted to the control assembly housing.

5. A control assembly as claimed in claim 1 wherein the control assembly is integrally formed in an electric switch unit whereby the actuator comprises an actuator of the electric switch for closing and opening contacts of the electric switch unit.

6. A control assembly as claimed in claim 1 wherein the output of the magnetic sensor includes a variable resistance that is indicative of at least one of the sensed first magnetic field reading and the second magnetic field reading.

7. A control assembly as claimed in claim 1 wherein the magnetic sensor includes a magneto-resistive material.

8. A control assembly as claimed in claim 1 wherein the speed or torque of operation of the electric device include a speed or torque of operation of an electric motor of the electric device.

9. A control assembly as claimed in claim 1 wherein the electric device includes at least one of an electric power tool and an electric gardening tool.

10. A control assembly as claimed in claim 1 wherein the magnetic shielding element includes a three-dimensional closed loop configuration having one opened face via which the interior of the shielding element may be accessed.

11. A control assembly as claimed in claim 1 wherein the magnetic element includes a cylindrical shaped configuration.

12. A control assembly as claimed in claim 1 wherein the magnetic shielding element is formed from a material including at least one of Fe-3% Si and Fe-8% Ni.

13. A control assembly for use in selectably controlling forward and reverse operation of an electric device, the control assembly including:
a control assembly housing;
a magnetic sensor;
a magnetic element;
an actuator that is configured for movement relative to the control assembly housing wherein responsive to said movement of the actuator relative to the control assembly housing, the magnetic sensor and magnetic element are moved relative to each other between at least one of a first position and a second position such that the magnetic sensor senses a first magnetic field reading when in the first position and senses a second magnetic field reading when in the second position;
a control module operably connected to the magnetic sensor and configured for controlling the electric device to operate in at least one of a forward operational mode and a reverse operational mode by reference to an output of the magnetic sensor indicative of the sensed first magnetic field reading and the second magnetic field reading respectively; and
a magnetic shielding element suitably shaped and positioned within the control assembly housing so as to alleviate a magnetic signal source external to the control assembly from interfering with the sensing by the magnetic sensor of the first and second magnetic field readings produced by the magnetic element in response to movement of the actuator.

14. A control assembly as claimed in claim 13 wherein the magnetic sensor includes a hall effect sensor.

15. A control assembly as claimed in claim 13 wherein the magnetic sensor is mounted to the control assembly housing and the magnetic element is mounted to the actuator.

16. A control assembly as claimed in claim 13 wherein the magnetic sensor is mounted to the actuator and the magnetic element is mounted to the control assembly housing.

17. A control assembly as claimed in claim 13 wherein the control assembly is integrally formed in an electric switch unit whereby the actuator comprises a reversing lever of the electric switch unit.

18. A control assembly as claimed in claim 13 wherein the output of the magnetic sensor includes a variable resistance that is indicative of at least one of the sensed first magnetic field reading and the second magnetic field reading.

19. A control assembly as claimed in claim 13 wherein the magnetic sensor includes a magneto-resistive material.

20. A control assembly as claimed in claim 13 wherein the forward and reverse operation of the electric device includes a forward and reverse operation of an electric motor of the electric device.

21. A control assembly as claimed in claim 13 wherein the electric device includes at least one of an electric power tool and an electric gardening tool.

22. A control assembly as claimed in claim 13 wherein the magnetic shielding element includes a three-dimensional closed loop configuration having one opened face via which the interior of the shielding element may be accessed.

23. A control assembly as claimed in claim 13 wherein the magnetic element includes a cylindrical shaped configuration.

24. A control assembly as claimed in claim 13 wherein the magnetic shielding element is formed from a material including at least one of Fe-3% Si and Fe-8% Ni.

* * * * *